(12) United States Patent  
Contreras et al.

(10) Patent No.: US 6,420,910 B1  
(45) Date of Patent: Jul. 16, 2002

(54) QUASI-CURRENT SENSING INPUT IMPEDANCE CONTROLLED PREAMPLIFIER FOR MAGNETORESISTIVE ELEMENTS

(75) Inventors: John Thomas Contreras; Paul Wingshing Chung, both of San Jose; Stephen Alan Jove, Watsonville; Klaas Berend Klaassen; Jacobus Cornelis Leonardus Van Peppen, both of San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/300,564

(22) Filed: Apr. 27, 1999

(51) Int. Cl.$^7$ .................................................. H03K 5/22
(52) U.S. Cl. ............................. 327/77; 327/560; 360/67
(58) Field of Search ................................. 327/427, 478, 327/52, 54, 56, 110, 332, 560, 561, 538, 541, 543, 77; 360/67, 315, 46

(56) References Cited

U.S. PATENT DOCUMENTS

| | | | |
|---|---|---|---|
| 5,270,882 A | * 12/1993 | Jove et al. | 360/67 |
| 5,331,478 A | * 7/1994 | Aranovsky | 360/67 |
| 5,534,818 A | * 7/1996 | Peterson | 327/545 |
| 5,559,460 A | * 9/1996 | Cunningham | 327/560 |
| 5,691,663 A | * 11/1997 | Nayebi et al. | 327/560 |
| 5,760,635 A | * 6/1998 | Nayebi et al. | 327/403 |
| 5,831,784 A | * 11/1998 | Barnett et al. | 360/67 |
| 5,859,739 A | * 1/1999 | Cunningham et al. | 360/67 |
| 5,986,840 A | * 11/1999 | Tada et al. | 360/67 |
| 6,038,090 A | * 3/2000 | Freitas | 360/46 |
| 6,111,716 A | * 8/2000 | Ngo et al. | 360/67 |

* cited by examiner

Primary Examiner—Terry D. Cunningham  
Assistant Examiner—Long Nguyen  
(74) Attorney, Agent, or Firm—Sawyer Law Group LLP (57) ABSTRACT

A method and system for providing a current-sensing preamplifier for use with a magnetoresistive sensor is disclosed. The method includes providing at least one input device coupled with the magnetoresistive sensor, providing a gain stage, and providing a feedback circuit. In a system aspect, the current-sensing preamplifier includes at least one input device. The at least one input device is coupled with the magnetoresistive sensor through an interconnect having a characteristic impedance. The at least one input device provides an input impedance for the current-sensing preamplifier. The current-sensing preamplifier also includes a gain stage coupled with the at least one input device and a feedback circuit coupled with the gain stage and the at least one input device. The feedback circuit provides at least one signal to the at least one input device. The at least one signal controls the input impedance based on at least one error signal.

18 Claims, 8 Drawing Sheets

QUASI-CURRENT SENSING INPUT IMPEDANCE CONTROLLED PREAMPLIFIER FOR MAGNETORESISTIVE ELEMENTS

FIELD OF THE INVENTION

The present invention relates to signal processing in a data storage device and more particularly to a method and system for providing a quasi-current sensing preamplifier having controlled input impedance.

BACKGROUND OF THE INVENTION

Magnetic recording media, such as disks are widely used for storing data. In order to write to or read from such recording media, storage devices such as disk drives are typically used. Storage devices typically include heads for reading from and/or writing to the recording media. A head is typically attached to a slider, which holds the head above the recording media. The slider is attached to a suspension, which supports the slider above the recording media. The slider is coupled to an actuator arm which moves the head, slider, and suspension across the recording media.

Currently magnetoresistive (MR) heads are increasingly popular for use in read heads. A MR head includes a MR sensor, which has a resistance that varies with an applied magnetic field. The MR sensor may be an anisotropic magnetoresistance (AMR) sensor or a giant magnetoresistance (GMR) sensor. In order to use the MR sensor, the MR sensor is coupled with electronics, which drive the MR sensor and read the signal from the MR sensor. The electronics are coupled with the MR sensor using a conductive interconnect.

The signal from the MR sensor can be read by sensing the current through the MR sensor. In order to do so, a conventional current-sensing preamplifier (conventional CS preamplifier) is used. Typically, an input of the conventional CS preamplifier is coupled with the interconnect and is included in a read/write integrated circuit for the head. Current is input to input devices in the conventional CS via the interconnect, and amplified by a gain stage in the conventional CS. The input devices typically include transistors. The amplified signal is then provided either as a single ended or differential signal to the remainder of the electronics.

Although the combination of the MR sensor, the interconnect, and the conventional CS preamplifier is capable of reading data on recording media, one of ordinary skill in the art will readily recognize that the ability of the storage device to read at higher data rates is limited. Previously, limitations in the bandwidth of the storage device were due to other portions of the electronics. However, improvements in other portions of the electronics have increased the bandwidths of these components of the storage device. As a result, the bandwidth for the storage device has increased. As the data rate increased, the interface between the MR sensor, the interconnect, and the conventional CS preamplifier has become of increasing importance in constraining the bandwidth of the storage device. In particular, the useful bandwidth of the conventional CS preamplifier as used in the storage device is limited. Thus, the ability of the storage device to read at higher data rates is also limited.

Conventional methods for addressing the limited bandwidth of the conventional CS preamplifier also have drawbacks. One reason for the limited bandwidth of the conventional CS preamplifier is the mismatch between the impedance of the MR sensor, a characteristic impedance of the interconnect, and the input impedance of the conventional CS preamplifier. The MR sensor has a resistance which can vary by a factor on the order of two or three to one. The interconnect typically has a relatively low characteristic impedance, generally approximately fifty ohms. The characteristic impedance of the interconnect also changes. Different heads may be used in the storage device. These heads occupy different positions within the storage device. In order to reach these heads, the interconnects may have different lengths or shapes. Furthermore, the interconnect typically twists and bends during use, thereby changing the characteristic impedance of the interconnect. The input devices of the conventional CS preamplifier have a low input impedance, much less than that of the interconnect. Thus, the conventional CS preamplifier has a low input impedance that is much less than the characteristic impedance of the interconnect.

Although conventional voltage-sensing (VS) preamplifiers can have an input impedance that is adjusted, such a solution does not improve the bandwidth of heads utilizing the conventional CS preamplifier. Conventional VS preamplifiers have an input impedance that is very high with respect to the impedance of the interconnect. In conventional VS preamplifiers, the mismatch between the impedance of MR sensor, the characteristic impedance of the interconnect, and the input of the conventional VS preamplifier can be partially addressed by providing a resistor coupled with input devices of the conventional VS preamplifier. The resistor is coupled in parallel with the bases of the transistors used as the input devices. This lowers the input impedance of the conventional VS preamplifier. However, one of ordinary skill in the art will readily recognize that the resistor causes increased signal attenuation, which is undesirable. Furthermore, the input impedance of the conventional CS preamplifier is already lower than the impedance of the interconnect. Consequently, such a method will not improve the bandwidth of the conventional CS preamplifier.

Accordingly, what is needed is a system and method for improving the bandwidth of the conventional CS preamplifier and, therefore, the data rate for the storage device. The present invention addresses such a need.

SUMMARY OF THE INVENTION

The present invention provides a method and system for providing a current-sensing preamplifier for use with a magnetoresistive sensor. The method comprises providing at least one input device coupled with the magnetoresistive sensor, providing a gain stage, and providing a feedback circuit. In a system aspect, the current-sensing preamplifier comprises at least one input device coupled with the magnetoresistive sensor. The at least one input device provides an input impedance for the current-sensing preamplifier. The current-sensing preamplifier further comprise providing a gain stage coupled with the at least one input device and a feedback circuit coupled with the gain stage and the at least one input device. The feedback circuit provides at least one signal to the at least one input device. The at least one signal controls the input impedance based on at least one error signal.

According to the system and method disclosed herein, the present invention provides a current-sensing preamplifier having a controllable input impedance. The input impedance of the current-sensing preamplifier can, therefore, be substantially matched to a desired valued. Thus, the operational bandwidth of a system using the current-sensing preamplifier can be increased, allowing for greater ability to read high frequency data from the magnetoresistive sensor.

DETAILED DESCRIPTION OF THE INVENTION

The present invention relates to an improvement in current-sensing preamplifier used in reading magnetoresistive (MR) sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a current-sensing preamplifier for use with a magnetoresistive sensor. The method comprises providing at least one input device coupled with the magnetoresistive sensor, providing a gain stage, and providing a feedback circuit. In a system aspect, the current-sensing preamplifier comprises at least one input device coupled with the magnetoresistive sensor. The at least one input device provides an input impedance for the current-sensing preamplifier. The current-sensing preamplifier further comprise providing a gain stage coupled with the at least one input device and a feedback circuit coupled with the gain stage and the at least one input device. The feedback circuit provides at least one signal to the at least one input device. The at least one signal controls the input impedance based on at least one error signal. Thus, the input impedance can be adapted to a change in the characteristic impedance of the interconnect.

The present invention will be described in terms of particular current-sensing preamplifiers having particular components. However, one of ordinary skill in the art will readily recognize that this method and system will operate effectively for other components in the current-sensing preamplifier. Furthermore, the present invention will be discussed in the context of controlling the input impedance based on certain criteria. However, one of ordinary skill in the art will readily realize that the method and system in accordance with the present invention operate effectively when the input impedance is controlled based on some other criteria. The present invention will also be discussed in the context of matching impedances. However, in the context of the present application, the impedances may be considered matched when they are not exactly identical.

Figure 1:
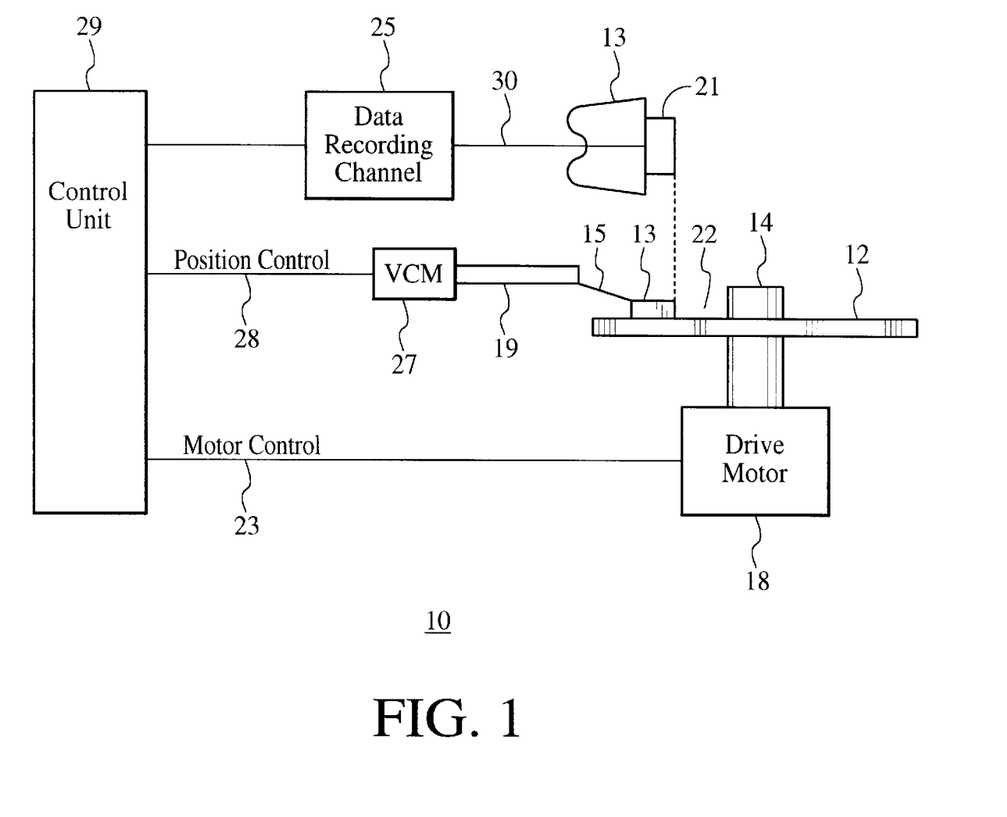
FIG. 1 is a block diagram of a storage device in which the present invention is utilized.

To more particularly illustrate the method and system in accordance with the present invention, refer now to FIG. 1, depicting a block diagram of a storage device 10 in which the present invention may be used. The storage device 10 shown is a disk drive. The disk drive 10 reads from and writes to at least one disk 12, which is supported on a spindle 14 and rotated by a disk drive motor 18. The disk 12 includes recording media on a surface 22 of the disk, which may be written to or read from using the disk drive 10.

The disk drive 10 also includes slider 13 that is shown positioned in proximity to the disk 13. Although only one slider 13 is shown, there may be multiple sliders used by the disk drive 10. The slider 13 supports one or more magnetic read heads and/or write heads. Note that a read head and a write head may be combined into a single head. The slider 13 is coupled to a suspension 15 that supports the slider 13.

The suspension 15 is coupled to an arm 19 which supports the suspension 15 and moves the suspension 15 and head across the surface 22 of the disk 12. The arm 19 is coupled with an actuator, depicted as a voice coil motor (VCM) 27 in FIG. 1. Based on a position control signal supplied from a control unit 29 via the line 28, the VCM 27 moves the actuator arm 19. This allows the actuator arm 19 to move the suspension 15 and, therefore, the slider 13 across the surface 22 of the disk 12.

Also depicted in FIG. 1 is the head 21, attached to the slider 13. Components (not depicted in FIG. 1) on the head 21 read from and write to the recording media on the surface 22 of the disk 12. In addition to providing the position control signal, the control unit 29 controls other operations of the disk drive 10. For example, read and write signals are provided to and from the head 21 via the data recording channel 25. The data recording channel 25 includes electronics, not explicitly shown in FIG. 1, for reading signals from the head 21 and controlling the head 21. The data recording channel is electrically coupled with the head using an interconnect 30. The interconnect 30 typically includes wires for providing electrical signals to and from the head 21.

Figure 2:
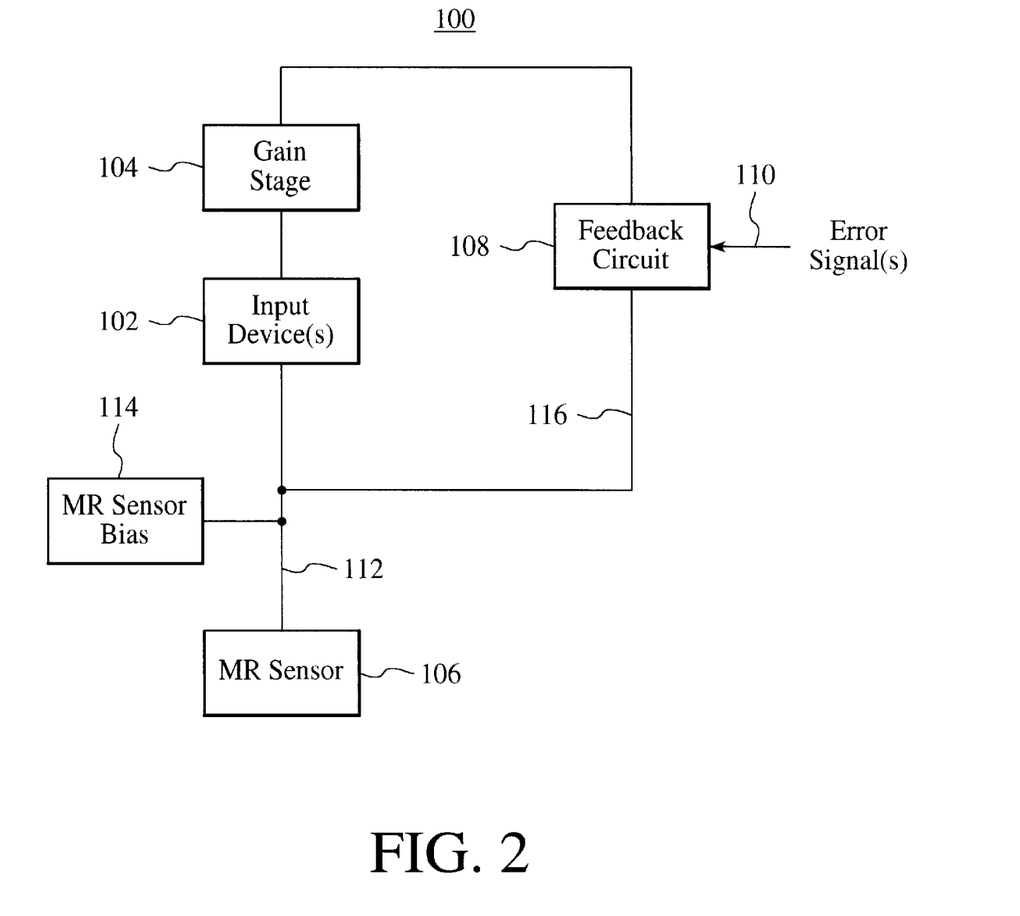
FIG. 2 is a high level block diagram of a quasi current-sensing controlled impedance preamplifier in accordance with the present invention as used for reading a magnetoresistance sensor.

FIG. 2 depicts a high-level block diagram of a quasi current-sensing controlled 20 input impedance (QCSC) preamplifier 100 in accordance with the present invention. The QCSC preamplifier 100 is termed a "quasi" current-sensing because the input impedance of the QCSC preamplifier 100 is greater than zero. The QCSC preamplifier 100 is used in conjunction with a magnetoresistive (MR) sensor 106. The MR sensor 106 is located in the head 21 and coupled with the QCSC preamplifier 100 via the interconnect 112. A magnetic field, for example generated by the recording media on the surface 22 of the disk 12, causes a change in the resistance of the MR sensor 106. These changes are used to read data stored by the recording media. The changes can be read because MR sensor bias 114, which is optionally incorporated into the QCSC preamplifier 100, properly biases the MR sensor 106. The MR sensor bias 114 can current bias or voltage bias the MR sensor 106. The interconnect 112 coupling the MR sensor 106 to the input devices 102 corresponds to the interconnect 13 depicted in FIG. 1.

Referring back to FIG. 2, the QCSC preamplifier 100 includes one or more input device(s) 102, which can be bipolar or field effect transistor (FET) devices. The QCSC preamplifier 100 also includes a gain stage 104, and a feedback circuit 108. The signal from the MR sensor 106 is provided to the input device(s) 102 of the QCSC preamplifier 100. The input device(s) preferably include one or more transistors. The feedback circuit 108 controls one or more signal(s) 116 based on one or more error signal(s) 110. Using the signal(s), the input impedance of the QCSC preamplifier 100 can be controlled. In a preferred embodiment, the signal(s) 116 subtract from or add to a bias current provided to the input device(s) 102. The bias current is an emitter or source current for input device(s) 102 which are bipolar transistors or FETs, respectively. When the signal(s) 116 add current to the bias current, the input impedance of the QCSC preamplifier 100 is reduced. When the signal(s) 116 subtract current from the bias current, the input impedance of the QCSC preamplifier is increased. This is because the impedance (Z) of input device(s) 102, which may be bipolar transistors, obey the following relationship:

$Z = V_t/I_{bias}$, where
$V_t$ = thermal voltage
$I_{bias}$ = current biasing the input device(s) 102 (emitter or source current)

The precise mathematical relationship between the impedance of the input device(s) 102 and the bias current differs when the input device(s) 102 are FETs. However, the general relationship is the same. When the bias, or source, current for the FET is increased, the impedance for the FET decreases, and vice versa.

As the bias current is increased, the impedance of the input device(s) and, therefore, the input impedance of the QCSC preamplifier 100 decreases. Similarly, as the bias current is decreased, the impedance of the input device(s) and, therefore, the input impedance of the QCSC preamplifier 100 increases. Thus, the input impedance of the QCSC preamplifier 100 can be controlled. As a result, the QCSC preamplifier 100 may be capable of adapting to changes in the system, such as changes in the characteristic impedance of the interconnect 112. In one embodiment, the input impedance of the QCSC preamplifier 100 is controlled to match the characteristic impedance of the interconnect 112. The input impedance of the QCSC preamplifier 100 can be controlled based on the resistance of the MR sensor 106. In a preferred embodiment, the input impedance of the QCSC preamplifier 100 is controlled without substantially affecting the biasing of the MR sensor 106.

Figure 3A:
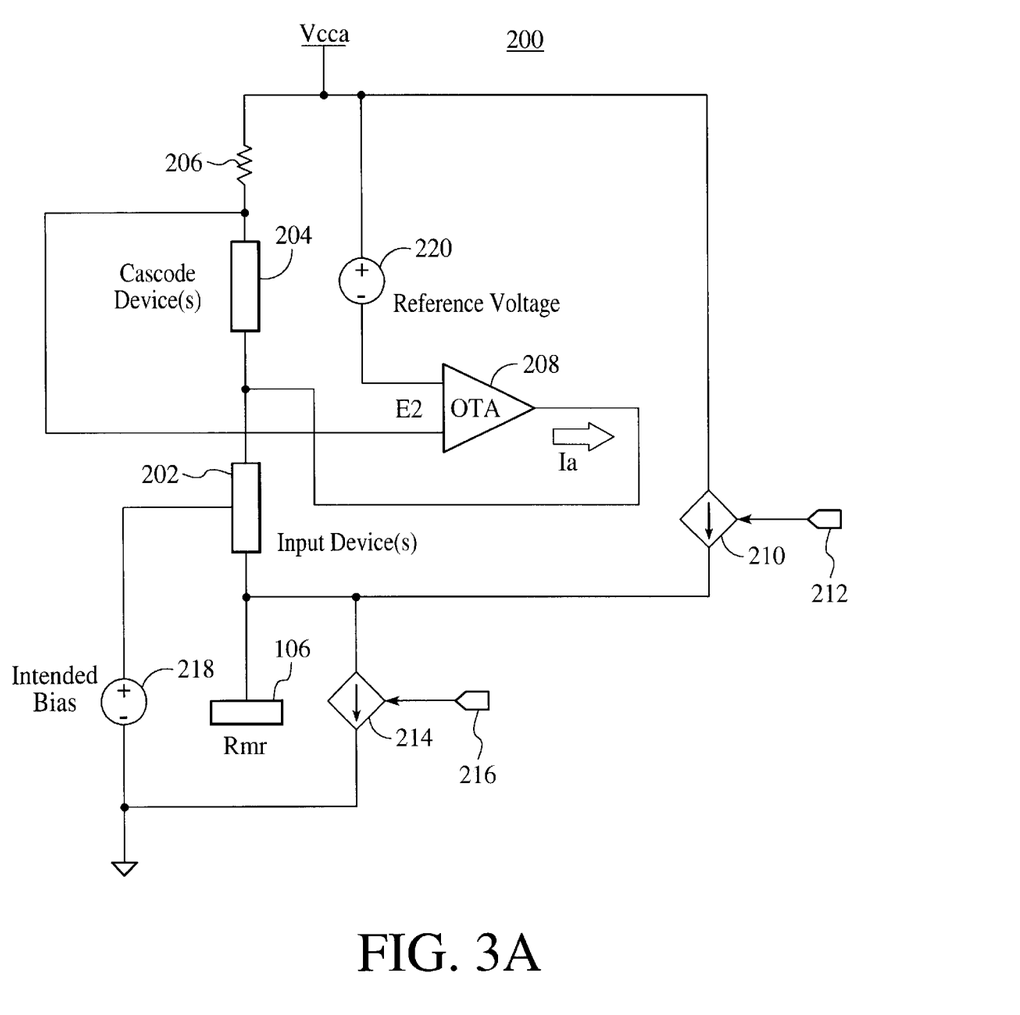
FIG. 3A is a high-level diagram of one embodiment of a voltage-biased quasi current-sensing controlled impedance preamplifier in accordance with the present invention as used for reading a magnetoresistance sensor.

FIG. 3A depicts a generalized embodiment of a quasi current sensing controlled input impedance (QCSC) preamplifier 200 in accordance with the present invention that may be used when voltage biasing the MR sensor 106. The QCSC preamplifier 200 may be either single-ended or differential. The QCSC preamplifier 200 includes one or more input device(s) 202 receiving input from the MR sensor 106. The input device(s) 202 preferably include at least one transistor. The input device(s) 202 receive a read signal from the MR element 106. Although not explicitly depicted in FIG. 3A, the input device(s) 202 receive the read signal via an interconnect, such as the interconnect 112 depicted in FIG. 2. Referring back to FIG. 3A, the QCSC preamplifier 200 also includes a resistor 206 for amplifying the read signal.

The QCSC preamplifier 200 also preferably includes one or more cascode device(s) 204 and an operational transconductance (OTA) amplifier 208 coupled to a reference voltage 220. The OTA amplifier 208 and cascode device(s) 204 are optional. The OTA amplifier 208 offsets DC current that would otherwise pass through the resistor 206, saturating the cascode device(s) 204 at a lower value of the resistor 206. Thus, the OTA amplifier allows a larger resistor 206 to be used, which would then provide a larger gain. Thus, the resistor 206, the OTA amplifier 208, and the cascode devices 204 could be considered part of the gain stage 104 depicted in FIG. 2. Referring back to FIG. 3A, also depicted is the intended bias voltage 218, which voltage biases the MR sensor 106.

The QCSC preamplifier 200 also includes a first signal generator 210 and a second signal generator 214. As depicted in FIG. 3A, the first and second signal generators 210 and 214 receive first and second error signals 212 and 216, respectively. The first and second signal generators 210 and 214, respectively, provide a first and second control signals, respectively, used to alter the impedance(s) of the input device(s) 202. Thus, the first and second signal generators 210 and 214, respectively, may be considered part of the feedback circuit 108 depicted in FIG. 2. Referring back to FIG. 3A, although termed signal generators, first and second signal generators 212 and 216, respectively, are preferably either current or voltage sources.

Referring back to FIG. 3A, the first signal generator 210 provides the first control signal based on the first error signal 212. The first control signal provided by the first signal generator 210 takes current away from a bias current supplied to the input device(s) 202. The bias current is the emitter or source current when the input devices(s) 202 are bipolar transistors or FETs, respectively. Thus, due to the relationship discussed above, the impedance of the input device(s) 202 is increased. Consequently, the input impedance for the QCSC preamplifier 200 is increased.

Similarly, the second signal generator 214 provides a second control signal based on the second error signal 216. The second control signal provided by the second signal generator 214 adds current to the bias current for the input device(s) 202. Thus, due to the relationship discussed above, the impedance of the input device(s) 202 is decreased. Consequently, the input impedance for the QCSC preamplifier 200 is decreased. Furthermore, the first and second control signals can take from or add to the bias current substantially without altering the current biasing the MR sensor 106. Consequently, controlling the input impedance of the QCSC preamplifier 200 substantially does not affect the performance or biasing of the MR sensor 106.

In an alternate embodiment, the two signal generators 210 and 214 could be replaced with a single signal generator which could increase or reduce the bias current. For example, the second signal generator 214 could be omitted. The first signal generator 210 would then provide current in two directions. The current in the first direction, shown in FIG. 3A, would reduce the bias current. The current in the second direction, opposite to the first direction, would increase the bias current. Thus, the single signal generator would control the bias current to the input device(s) 202 and, therefore, control the input impedance of the QCSC 200.

The first and second error signals 212 and 216, respectively, can be controlled so that input impedance of the QCSC preamplifier 200 is controlled in any manner desired. Thus, the input impedance of the QCSC preamplifier 200 is adaptive. In one embodiment, the first and second error signals 212 and 216, respectively, are provided such that the input impedance of the QCSC preamplifier 200 is the same as the characteristic impedance of the interconnect 112. The input impedance of the QCSC preamplifier 200 may also adapt to changes in the system or the characteristic impedance of the interconnect 112. In another embodiment, the input impedance of the QCSC preamplifier 200 is varied. For example, in one embodiment, the input impedance of the QCSC preamplifier 200 is controlled to match the impedance of the MR sensor 106 over a particular range of values. However, nothing prevents the use of another control scheme for the input impedance of the QCSC preamplifier 200.

Figure 3B:
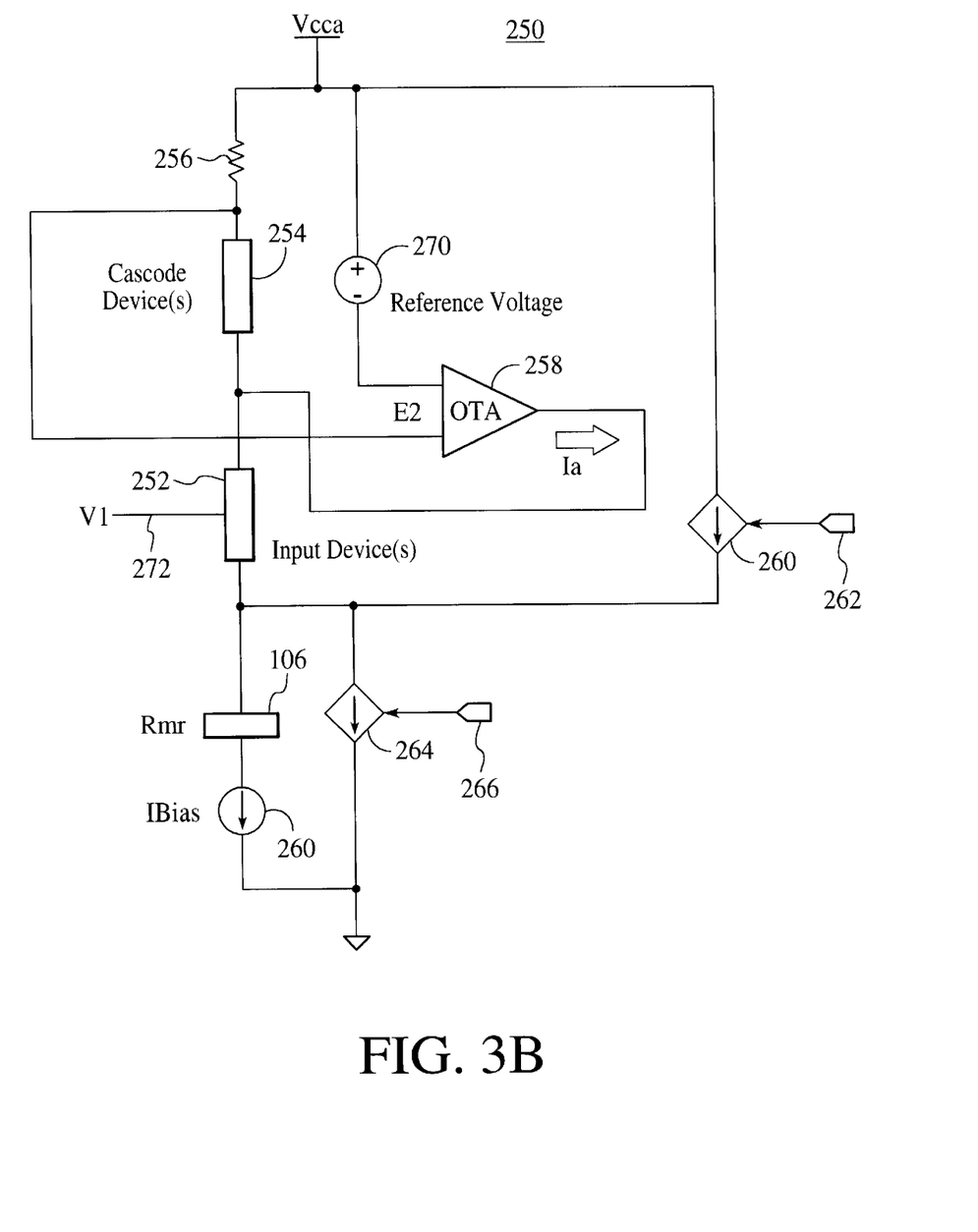
FIG. 3B is a high-level diagram of one embodiment of a current-biased quasi current-sensing controlled impedance preamplifier in accordance with the present invention as used for reading a magnetoresistance sensor that is current biased.

FIG. 3B depicts a generalized embodiment of a QCSC preamplifier 250 in accordance with the present invention that may be used when current biasing the MR sensor 106. The QCSC preamplifier 250 may be single-ended or differential. The QCSC preamplifier 250 includes one or more input device(s) 252 receiving input from the MR sensor 106. The input device(s) 252 preferably include at least one transistor. The input device(s) 252 receive a read signal from the MR element 106. Although not explicitly depicted in FIG. 3B, the input device(s) 252 receive the read signal via an interconnect, such as the interconnect 112 depicted in FIG. 2. Referring back to FIG. 3B, the QCSC preamplifier 250 also includes a resistor 256 for amplifying the read signal.

The QCSC preamplifier 250 also preferably includes one or more cascode device(s) 254 and an OTA amplifier 258 coupled to a reference voltage 270. The OTA amplifier 258 and cascode device(s) 254 are optional. The OTA amplifier 258 allows for a larger resistor 256, which can provide a larger gain. Thus, the resistor 256, the OTA amplifier 258, and the cascode device(s) 254 could be considered part of the gain stage 104 depicted in FIG. 2. Referring back to FIG. 3B, also depicted is the intended current bias 268, which current biases the MR sensor 106. In addition, an input voltage 272 is provided to forward bias the input device(s) 252.

The QCSC preamplifier 250 also includes a first and second signal generators 260 and 264, respectively. The first and second signal generators 260 and 264 receive first and second error signals 262 and 266, respectively. The first and second signal generators 260 and 264, respectively provide a first control signal and a second control signal, respectively, used to alter the impedance(s) of the input device(s) 252. Thus, the first and second signal generators 260 and 264, respectively, may be considered part of the feedback circuit 108 depicted in FIG. 2. Referring back to FIG. 3B, although termed signal generators, first and second signal generators 262 and 266, respectively, are preferably either current or voltage sources.

Referring back to FIG. 3B, the first signal generator 260 provides the first control signal based on the first error signal 262. The first control signal provided by the first signal generator 260 takes current away from a bias current for the input device(s) 252. The bias current is the emitter or source current when the input device(s) 252 are bipolar transistors or FETs, respectively. Thus, due to the relationship discussed above, the impedance of the input device(s) 252 is increased. Consequently, the input impedance for the QCSC preamplifier 250 is increased.

Similarly, the second signal generator 264 provides a second control signal based on the second error signal 266. The second control signal provided by the second signal generator 264 adds current to the bias current for the input device(s) 252. Thus, due to the relationship discussed above, the impedance of the input device(s) 252 is decreased. Consequently, the input impedance for the QCSC preamplifier 250 is decreased. The first and second control signals can take from or add to the bias current substantially without altering the current biasing the MR sensor 106. Consequently, controlling the input impedance of the QCSC preamplifier 250 substantially does not affect the performance or biasing of the MR sensor 106. In other words, control of the input impedance and the MR sensor 106 biasing are orthogonally related.

In an alternate embodiment, the two signal generators 260 and 264 could be replaced with a single signal generator which could increase or reduce the bias current. For example, the second signal generator 264 could be omitted. The first signal generator 260 would then provide current in two directions. The current in the first direction, shown in FIG. 3A, would reduce the bias current. The current in the second direction, opposite to the first direction, would increase the bias current. Thus, the single signal generator would control the bias current to the input device(s) 252 and, therefore, control the input impedance of the QCSC 250.

The first and second error signals 262 and 266, respectively, can be controlled so that input impedance of the QCSC preamplifier 250 is controlled in any manner desired. Thus, the input impedance of the QCSC preamplifier 25.0 can adapt to changes in the system. In one embodiment, the first and second error signals 262 and 266, respectively, are provided such that the input impedance of the QCSC preamplifier 250 is the matched with the characteristic impedance of the interconnect 112. The input impedance of the QCSC preamplifier 250 may be adapted to changes in the characteristic impedance of the interconnect in another manner. For example, in one embodiment, the input impedance of the QCSC preamplifier 250 is controlled to match the characteristic impedance of the interconnect 112 only over a particular range of values. However, nothing prevents the use of another control scheme for adapting the input impedance of the QCSC preamplifier 250.

Figure 4:
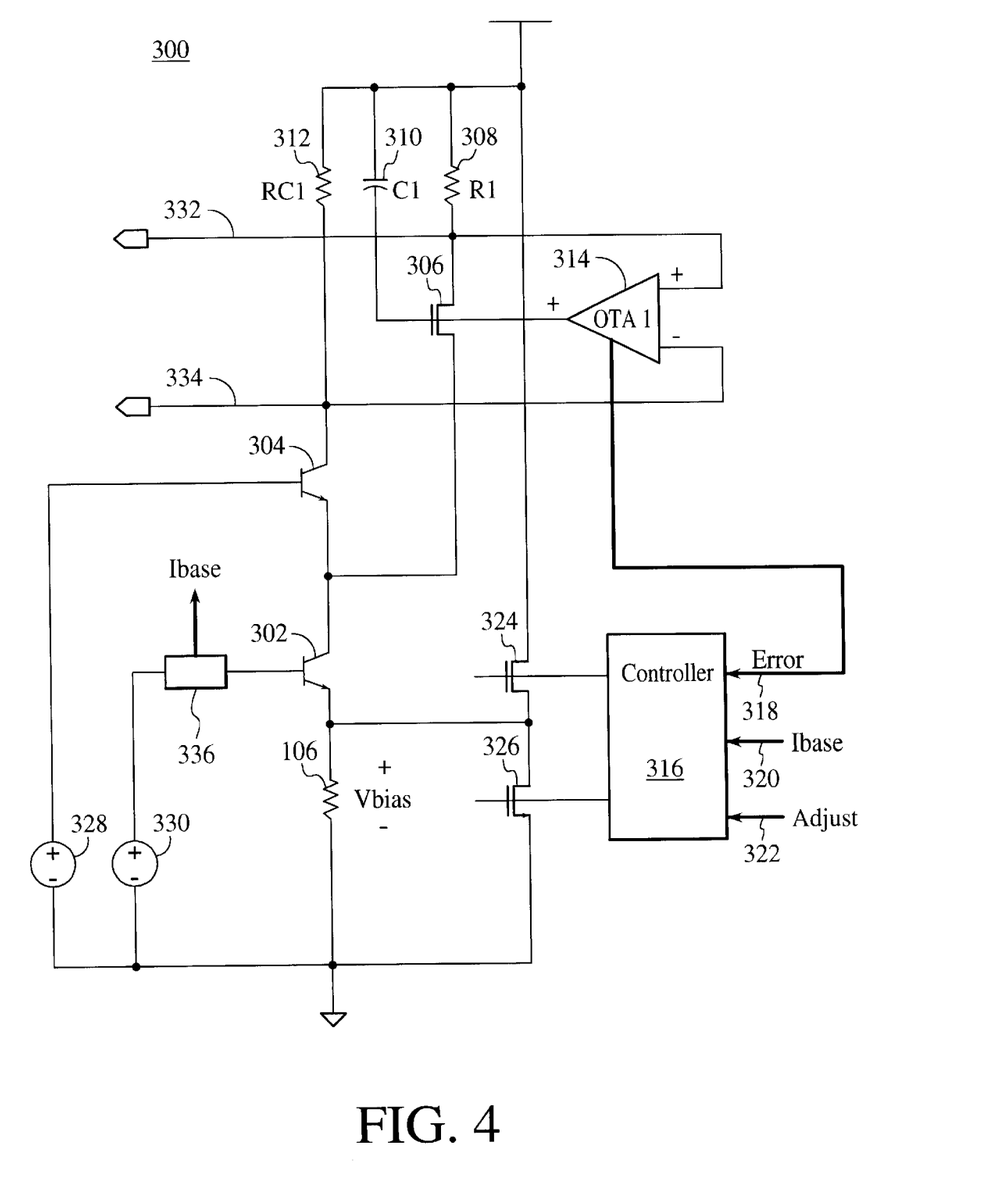
FIG. 4 is a diagram of one embodiment of a single-ended voltage-biased quasi current-sensing controlled impedance preamplifier in accordance with the present invention as used for reading a magnetoresistance sensor that is voltage biased.

FIG. 4 depicts a diagram of one embodiment of a QCSC preamplifier 300 in accordance with the present invention that may be used when voltage biasing the MR sensor 106. The QCSC preamplifier 300 also has a quasi-differential output. The QCSC preamplifier 300 includes a transistor 302, which act as an input device. By controlling a bias current, such as the emitter or source current, through the transistor 302, the QCSC preamplifier controls its input impedance. The QCSC preamplifier 300 also includes resistors 308 and 312, capacitor 310, and OTA 314. The QCSC preamplifier 300 further includes additional transistors 304, 306, 324, and 326, as well as controller 316. The transistor 304 acts as a cascode device. The controller 316 and transistors 324 and 326 are considered part of the feedback circuit 108 depicted in FIG. 2. Referring back to FIG. 4, also depicted are voltage sources 328 and 330, as well as the MR sensor 106. The voltage source 330 provides a voltage to the base of the transistor 302 to bias the transistor 302 into the active region. In addition, the voltage source 330 biases the MR sensor 106 with a voltage. The voltage source 328 provides a voltage to the base of the transistor 304 to bias the transistor 302 into the active region. Although not explicitly depicted in FIG. 4, the transistor 302 is coupled with the MR sensor 106 via an interconnect, such as the interconnect 112 depicted in FIG. 2.

Referring back to FIG. 4, the QCSC preamplifier 300 thus receives the read signal via an interconnect. The QCSC preamplifier 300 amplifies the read signal, via resistor 312. The capacitor 310 aids in stabilizing the feedback loop that includes the controller 316, the OTA 314, and transistors 306, 324, and 326. The OTA 314 of the QCSC preamplifier 300 allows for quasi-differential output over the lines 332 and 334. The OTA 314 also supplies a feedback error signal 318 to the controller 316.

The controller 316 controls the input impedance of the QCSC preamplifier 300 by controlling the bias current for the transistor 302. The controller 316 receives a feedback error signal 318, a base current error signal 320, and an adjust error signal 322. The feedback error signal is provided from the OTA 314. The base current error signal 320 is provided from the device 336 and indicates the base current being provided to the base of the transistor 302. The base current error signal 320 is preferably simply a replica of the base current. Thus, the device 336 preferably replicates the base current. The adjust error signal 322 may be used to allow a user to adjust input impedance of the QCSC preamplifier 300. For example, the adjust signal error 322 may be provided from a knob (not shown) or its electrical equivalent which a user turns to change the input impedance of the QCSC preamplifier 300.

Based on the feedback error signal 318, the base current error signal 320, and the adjust error signal 322, the controller 316 changes the signal applied to the gate of each transistor 324 and 326. The transistor 324 can be used to reduce the bias current. The transistor 326 can be used to increase the bias current. Thus, the transistors 324 and 326 behave similarly to the first and second signal generators 210 and 214, respectively, depicted in FIG. 3A. Referring back to FIG. 4, the transistors 324 and 326 can thus increase or reduce, respectively, the input impedance of the QCSC preamplifier 300 by decreasing or increasing, respectively, the bias current.

The controller 316 can control the input impedance of the QCSC preamplifier in a number of ways. How the input impedance is changed depends upon how the controller 316 reacts to the feedback error signal 318, the base current error signal 320, and the adjust error signal 322. In one embodiment, the controller 316 controls the bias current based on a set of routines provided to the controller 316. The QCSC preamplifier 300 can thus match its input impedance to the characteristic impedance of the interconnect (not explicitly labeled in FIG. 4), or change its input impedance in another fashion. Thus, the QCSC preamplifier 300 can adapt its input impedance to respond to changes in the system.

Figure 5:
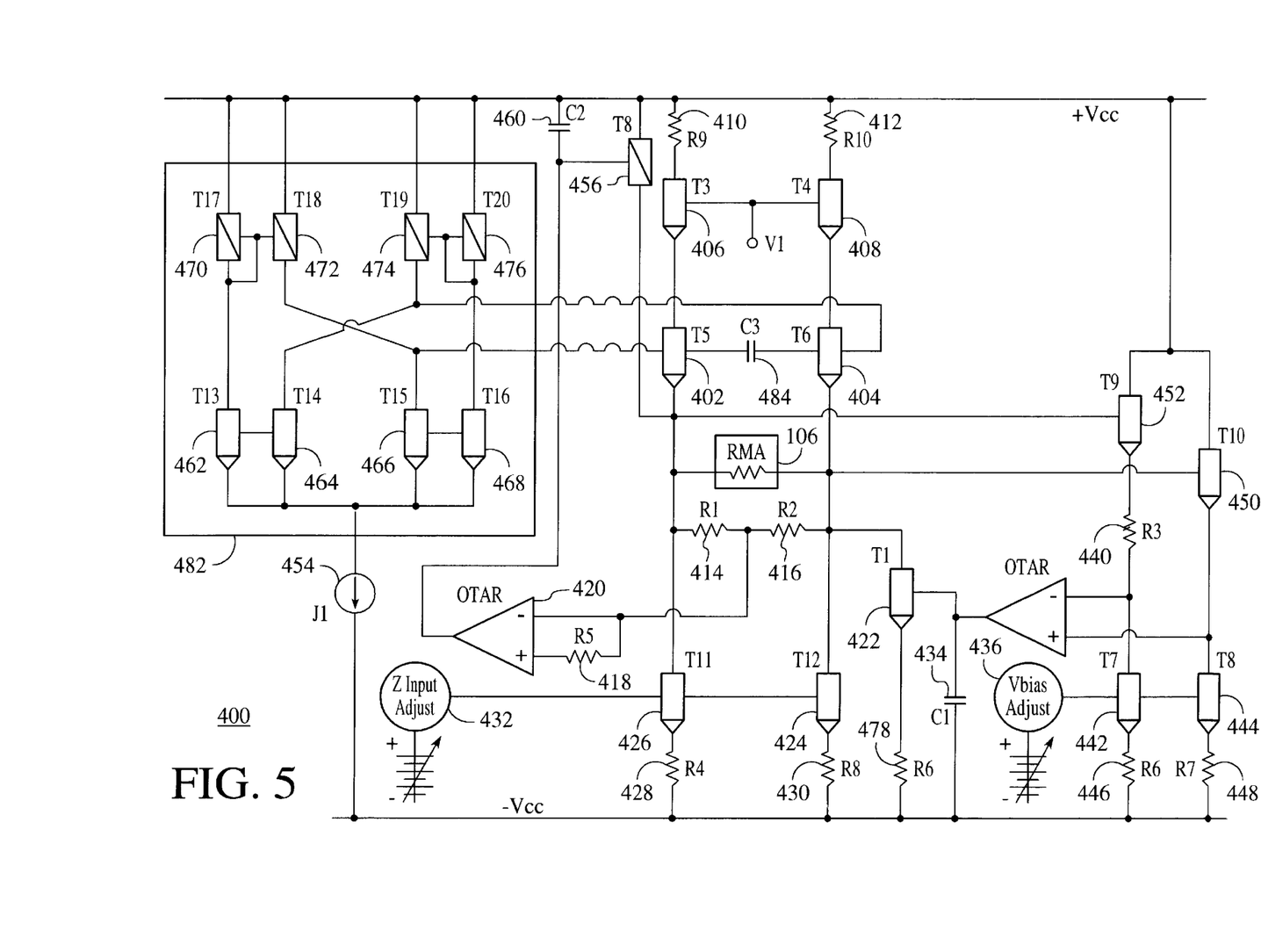
FIG. 5 is a diagram of one embodiment of a quasi current-sensing controlled impedance preamplifier in accordance with the present invention using a differential feedback circuit, as used for reading a magnetoresistance sensor.

FIG. 5 depicts an embodiment of a differential QCSC preamplifier 400 in accordance with the present invention for use in reading the MR sensor 106. The QCSC preamplifier 400 includes a current source 454, transistors 402 and 404 which function as input devices, transistors 406 and 408 which function as cascode devices, and resistors 410 and 412 which are gain resistors. The current source 454 provides a current of $J_1$. The QCSC preamplifier 400 forward gain path and MR sensor 106 biasing circuitry includes transistors 422, 442, 444, 450, 452, and 456, resistors 414, 416, 418, 440, 446, 448, and 478, capacitors 434, 484, and 460, and OTAs 420 and 438, and a voltage bias adjust 436, which are used to bias the MR sensor 106. The QCSC preamplifier 400 also includes a feedback stage to eliminate DC offset and means for adjusting the input impedance of the QCSC preamplifier 400 including a level shifter 480, transistors 424, 428, 462, 464, 466, 468, 470, 472, 474, and 476, resistors 428 and 430, and an input impedance adjust 432 that are used to control and adjust the impedance of the transistors 402 and 404. Thus, the input impedance of the QCSC preamplifier 400 can be controlled. Note that biasing of the MR sensor 106 in the QCSC preamplifier 400 is orthogonally related to controlling the input impedance of the QCSC preamplifier 400. Consequently, the input impedance of the QCSC preamplifier 400 can be controlled substantially without adversely affecting the biasing of the MR sensor 106. In addition, it is noted that the QCSC preamplifier 400 functions as desired when $\beta J_1$ is greater than or equal to the sum of the currents through the collectors of transistors 424 and 426.

The MR sensor 106 is desired to be biased so that the center of the MR sensor 106 is at ground. In addition, the MR sensor 106 is biased such that the voltage across the MR sensor 106 is the same as the voltage across the resistor 440. To accomplish this, the biasing of the left and right sides of the MR sensor 106 are controlled. In order to control the right, or more negatively biased side of the MR sensor 106, the transistors 450 and 452 are used. Transistors 450 and 452, which function as emitter followers, are biased from currents through transistors 442 and 444, respectively. These currents are the substantially same because the bases of the transistors 442 and 444 are connected together. These currents are also adjustable using the voltage bias adjust 436. Thus, the voltage across the resistor 440 is equal to the current biasing the transistors 452 or 450 multiplied by the resistance of the resistor 440. The voltage across the resistor 440 is desired to be provided across the MR sensor 106. The OTA 438 determines the difference between two nodes, one at the bottom of the resistor 440 and the other at the collector of the transistor 444. The OTA 438 provides a controlled voltage to the transistor 422, which removes current from the negatively biased (right) side of the MR sensor 106. This changes the bias of the MR sensor 106. When the voltages at the nodes measured by the OTA 438 are the same, the error between the nodes is minimized. Thus, the appropriate current is pulled from the MR sensor 106 to ensure that the voltage across the MR sensor 106 is the same as the voltage across the resistor 440. Note that the resistor 478 provides for a predetermined gain and the capacitor 434 acts to stabilize the loop controlling the negative side of the MR sensor 106.

In order to bias the MR sensor 106, the left, or positively biased side of the MR sensor 106 is also controlled. This is accomplished using the resistors 414, 416, and 418, the OTA 420, the capacitor 460 and the transistor 456. The capacitor 460 stabilizes the loop. The resistors 414, 416, and 418 provide a measurement of the difference between the voltage of the center of the MR sensor 106 and ground. The OTA 420 senses this difference and applies a signal to the gate of the transistors 456, which is a PFET in the embodiment of the QCSC preamplifier 400 shown. The transistor 456 provides the current to the positively biased (left) side of the MR sensor 106. When the current provided to the MR sensor 106 is the same as the current taken from the MR sensor 106, the voltage at the center of the MR sensor 106 is ground. As discussed above, the current from the MR sensor 106 is set to ensure that the MR sensor 106 has a voltage across it equal to the voltage across the resistor 440. Thus, the MR sensor 106 is biased as desired.

In addition, the QCSC preamplifier 400 has an input impedance which is controlled and can be adapted to changes in the system, such as changes in the characteristic impedance of the interconnect 112 (not explicitly labeled in FIG. 5). In order to use the QCSC preamplifier 400, the voltages of the bases of the input devices, transistors 402 and 404, are controlled. There is a difference in the voltages developed at the emitters of the transistors 402 and 404 due to the voltage across the MR sensor 106. This voltage difference is desired to be developed across the bases of the transistors 402 and 404 to help to prevent a large offset between the resistors 410 and 412.

When the equal currents through the transistors 402 and 404 are substantially the same, the transistors 402 and 404 have substantially the same base-emitter voltages. Thus, the voltage difference between the bases of the transistors 402 and 404 should be the same as the voltage across the MR sensor 106. To ensure this voltage difference is developed, substantially the same current should flow the through the transistors 402 and 404. In order to provide substantially equal currents, an offset between the resistors 410 and 412 is used. When the offset is controlled to be zero, the same current will flow through the transistors 402 and 404 and the desired voltage difference is developed between the bases of the transistor 402 and 404. The offset is provided to the level shifter 480. The level shifter 480 shifts the offset to provide an error voltage of the correct common mode potential to the transistors 462, 464, 466, and 468. The transistors 462, 464, 466, 468, 470, 472, 474, and 476 function as an OTA 482 that controls the voltage to the bases of the transistors 402 and 404.

The transistors 462, 464, 466, and 468 function as input devices for the OTA 482. The transistors 470 and 472 function as a first current mirror. The transistors 474 and 476 function as a second current mirror. The transistors 470 and 472 are used because the transistor 462 is desired to provide a pushing current. A pushing current is a current derived from a p type device which directs current away from the positive supply $V_{EE}$. A pulling current is derived from an n type device that directs current into the negative supply, such as $V_{cc}$. A pushing current is desired to be provided from the transistor 462, which is an npn device. Similarly, the transistors 474 and 476 are used because the transistor 468 is also desired to provide a pushing current, but is an npn device. The transistors 464 and 466 supply a pulling current. The input from the level shifter 480 activates the OTA 482. The output of the OTA 482 is provided to the bases of the transistors 402 and 404. When there is no offset between the inputs to the level shifter 480, the voltage between the bases of the transistors 402 and 404 matches the voltage across the MR sensor 106. Thus, the desired voltage is developed between the bases of the transistors 402 and 404 and the same current flows to the collectors of the transistors 402 and 404.

The impedances of the transistors 402 and 404 can be varied by varying the emitter currents of the transistors 402 and 404. These currents are controlled by controlling the collector currents of the transistors 426 and 424. The collector currents for the transistors 424 and 426 are substantially the same because the resistors 428 and 430 are substantially the same. By varying the voltage provided to the bases of the transistors 424 and 426 by the input impedance adjust 432, the current provided to the emitters of the transistors 404 and 402, respectively, is changed. Thus, the impedances of the transistors 402 and 404 and, therefore, the input impedance of the QCSC preamplifier 400 is controlled. In addition, note that the voltages to the bases of the transistors 424 and 426 are controlled together, allowing the collector currents for the transistors 424 and 426 to be controlled together. Thus, the emitter currents and impedances of the transistors 402 and 404 are controlled together. The differential input impedance of the QCSC preamplifier 400 is thereby controlled.

Thus, by varying the input impedance adjust 432, the input impedance of the QCSC preamplifier 400 can be controlled. The input impedance adjust 432 can be varied based on a number of schemes, allowing the input impedance of the QCSC preamplifier to be adaptive. For example, in one embodiment, the input impedance of the QCSC preamplifier can be controlled to adapt to changes in the characteristic impedance of the interconnect 112. In another embodiment, As in the QCSC preamplifier 100, 150, 200, 250, and 300, as well as the QCSC preamplifiers 500 and 600 (discussed below) this may be accomplished without a direct measurement of the impedance of the interconnect 112. In a preferred embodiment, the input impedance of the QCSC preamplifier 400 is controlled to match the characteristic impedance of the interconnect 112.

In addition, the input impedance of the QCSC preamplifier 400 can be adapted to the MR sensor 106. Typically, the wiring of the interconnect 112 has a characteristic impedance of approximately fifty to fifty five Ohms. These interconnects 112 are generally designed to deal with MR heads and, therefore, MR sensor 106 having a certain range of values. Systems using such interconnects typically perform better for higher resistances of the MR sensor 106. It is generally desirable to match the input impedance of the QCSC preamplifier 400 to that of the interconnect 112 for systems using a higher resistance MR sensor 106. Thus, the input impedance adjust 432 would be controlled to try to ensure that the input impedance of the QCSC preamplifier 200 matches the characteristic impedance of the interconnect 112. However, some MR sensors 106 have lower resistances. Once the resistance of the MR sensor 106 drops below a particular threshold, the QCSC preamplifier 400 could be controlled to minimize its input impedance. Thus, the input impedance adjust 432 controls the input impedance of the QCSC preamplifier 400 could be controlled to be minimized. Thus, the input impedance of the QCSC preamplifier can adapt to the resistance of the MR sensor 106. In addition, the QCSC preamplifier 100, 200, 250, and 300 could be controlled to adapt to the MR sensor 106 resistance. Similarly, the QCSC preamplifier 500 and 600 (discussed below) could be controlled to adapt to the MR sensor 106 resistance.

Note that the QCSC preamplifier 400 also provides an added benefit, protection against conductive asperities contacting the MR sensor 106. Conductive asperities are usually very transient in nature, lasting for only a very short time. The bases of the transistors 402 and 404 have a very high DC common mode impedance. As a result, it is relatively easy to shift the voltages to both the bases of the transistors 402 and 404 in a common mode fashion. The voltages at the bases of the transistors 402 and 404 are controlled by the base-emitter voltages of the transistors 402 and 404 and the voltages at the emitters of the transistors 402 and 404. The base-emitter voltages of the transistors 402 and 404 are substantially the same because the emitter currents of the transistors 402 and 404 are substantially the same. The MR sensor 106 may contact a conductive asperity, such as on a disk, that is grounded. When this occurs, the common mode voltage at the bases of the transistors 402 and 404 very rapidly change accordingly. Thus, a large current will not be instantaneously be driven through the MR sensor 106.

Consequently, the MR sensor 106 may not be destroyed. Thus, in addition to having a controlled, adaptive input impedance, the QCSC preamplifier provides protection against contact with conductive asperities for a short period of time. A short period of time is short in relation to the response time of the involved feedback loops.

Figure 6:
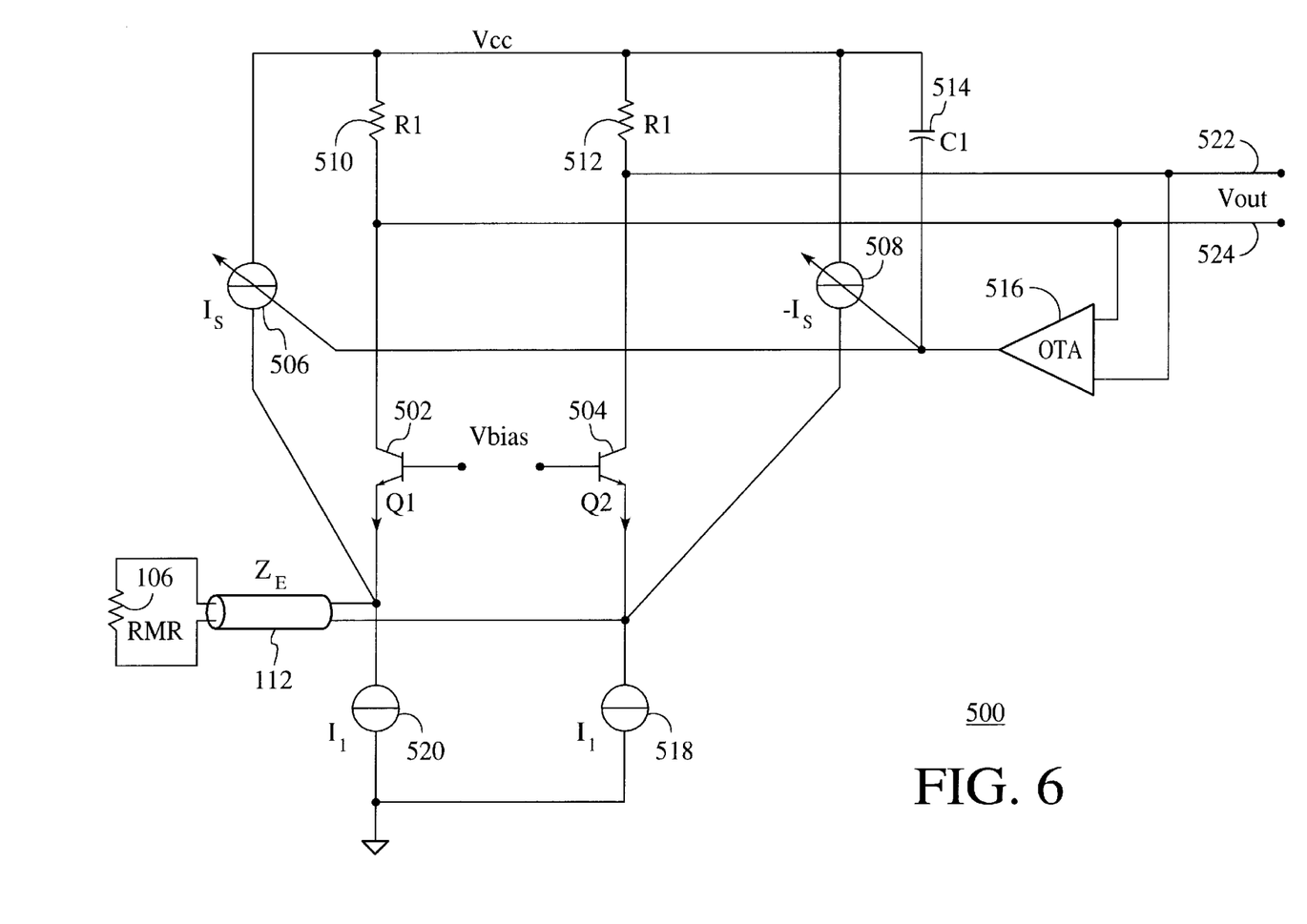
FIG. 6 is a diagram of one embodiment of a differential quasi current-sensing controlled impedance preamplifier in accordance with the present invention which controls the input impedance based on the impedance of the interconnect.

As discussed above, the QCSC preamplifiers 100, 200, 250, 300, and 400 can be used to always substantially match the characteristic impedance of the interconnect 112 or vary its input impedance in another fashion. Thus, the input impedances of the QCSC preamplifier 100, 200, 250, 300, and 400 can adapt to changes in the system, such as the disk drive 10. FIG. 6 depicts one embodiment of a QCSC preamplifier 500 which is used to ensure that the input impedance of the QCSC preamplifier 500 matches the characteristic impedance of the interconnect 112. The QCSC preamplifier 500 is also differential preamplifier. The QCSC preamplifier is coupled to the MR sensor 106 via the interconnect 112.

The QCSC preamplifier 500 includes current sources 518 and 520, transistors 502 and 504, resistors 510 and 512, OTA 516, and capacitor 514. The QCSC preamplifier 500 also includes current sources 506 and 508. Feedback, which includes the OTA 516, essentially eliminates any offset in the output of the QCSC preamplifier 500. The capacitor 514 is used to shunt the feedback, amplifying the input signals in the frequency range of interest. A high-pass pole is set in part by the gain of the OTA 516. The output is provided by the lines 522 and 524.

The transistors 502 and 504 functions as input devices. Thus, the input impedance of the QCSC preamplifier 500 may be adjusted by adjusting the bias current, such as the emitter or source current, for the transistors 502 and 504. The input impedance for the QCSC preamplifier 500 is $2*V_t/I$, where I is provided from current sources 518 and 520. Thus, the bias current of the transistors 502 and 504 is set to match the input impedance of the QCSC preamplifier 500 to the characteristic impedance of the interconnect 112.

Figure 7:
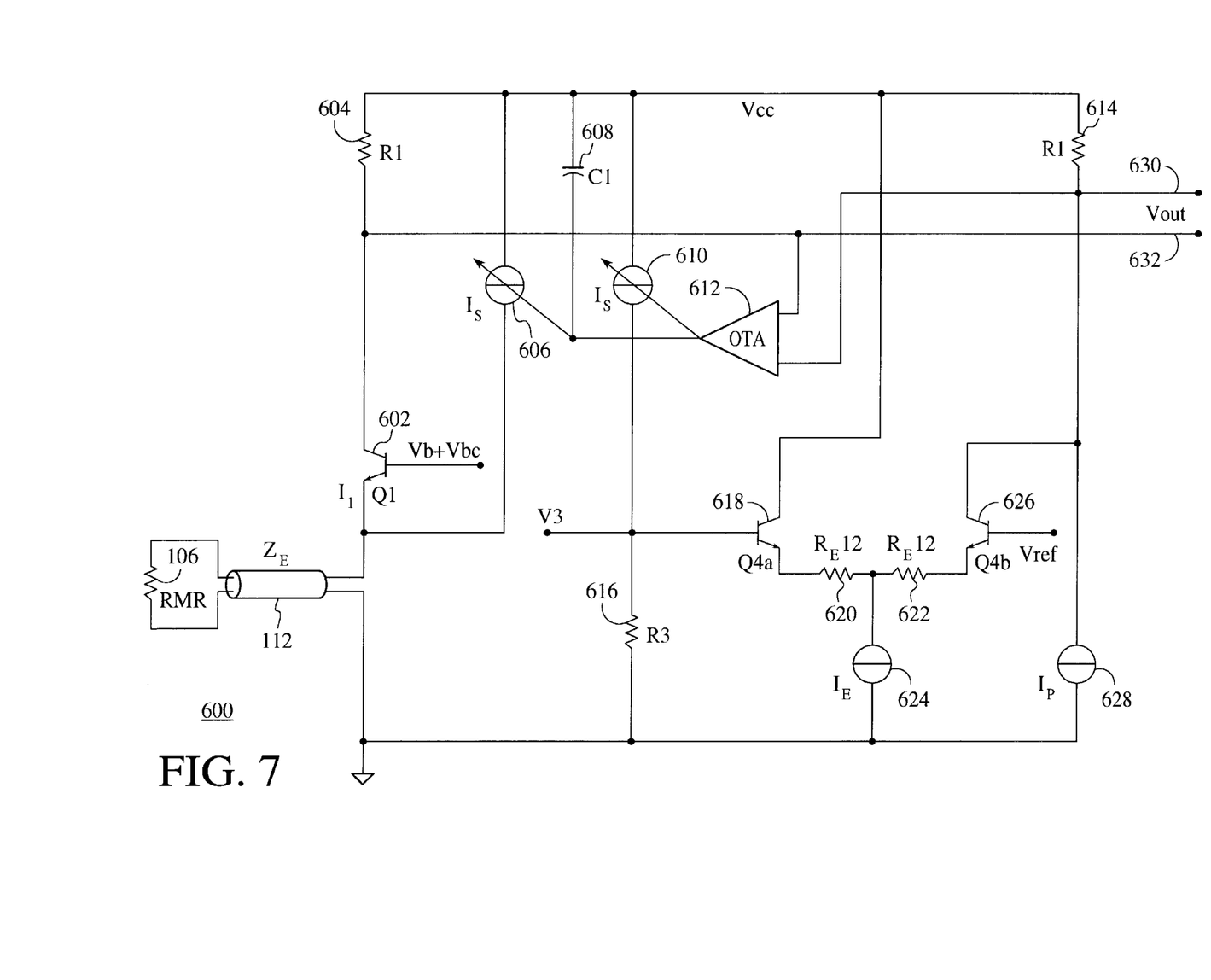
FIG. 7 is a diagram of one embodiment of a single-ended quasi current-sensing controlled impedance preamplifier in accordance with the present invention which controls the input impedance based on the resistance of the magnetoresistive sensor.

FIG. 7 depicts one embodiment of a single-ended QCSC preamplifier 600 which is used to control the input impedance of the QCSC preamplifier 500 based on the resistance of the MR sensor 106. The QCSC preamplifier 500 is coupled to the MR sensor 106 via the interconnect 112. In one embodiment, the input impedance of the QCSC preamplifier 600 is controlled to match that of the interconnect 112 only over a particular range of values. Otherwise the input impedance of the QCSC preamplifier 600 is minimized. In the embodiment shown, the input impedance of the QCSC preamplifier 600 is matched to the characteristic impedance of the interconnect when the product of the input impedance and the resistance of the MR sensor 106 divided by the characteristic impedance of the interconnect 112 is greater than the sum of the input impedance of the QCSC preamplifier 600 and the resistance of the MR sensor minus the characteristic impedance of the interconnect 112. Otherwise, the input impedance of the QCSC preamplifier 600 is minimized. Thus, the input impedance of the QCSC preamplifier 600 can be adapted to changes in the resistance values of the MR sensor 106.

The QCSC preamplifier 600 includes transistors 602, 618, and 626, current sources 606, 610, 624, and 628, resistors 604, 614, 616, 620, and 622, OTA 612, and capacitor 608. The read signal from the MR sensor 106 is provided to the transistor 602. The capacitor 514 is used to shunt the feedback, amplifying the input signals in the frequency range of interest. The read signal is amplified by the QCSC preamplifier 600 and output over lines 630 and 632.

The bias, or emitter, current through the transistor 602, the input device, is set by the current source 628. The feedback through the OTA 612 and the control current from the current source 606 eliminates dc voltage offset at the output of the QCSC preamplifier 600. Because the bias current is controlled by current source 628, the impedance of the transistor 602 and, therefore, the input impedance of the QCSC preamplifier 600 can be controlled. In a preferred embodiment, the current from the current source 628, $I_O$, is set so that the input impedance of the QCSC preamplifier 600 matches the impedance of the interconnect 112.

In addition, the input impedance of the QCSC preamplifier 600 can be controlled as a function of the resistance of the MR sensor 106. This ability is provided by the combination of the transistors 618 and 626, the current source 624, the emitter resistance $R_E$ (shown as resistors 620 and 622), and the voltages applied to the bases of the transistors 618 and 626. The voltage provided to the base of the transistor 626 is a reference voltage, $V_{ref}$. The voltage applied to the base of the transistor 618, $V_3$, is controlled by the resistor 616 and the current, $I_E$, from the current source 610. The input impedance is given by:

$$\text{input impedance} = V_t*(1-R_3/R_E)/[I_O+I_E/2+(V_3-R_3*V_{bias}/R_{MR})/R_E)]$$

where $R_3$=the resistance of the resistor 604 and $V_t$=the thermal voltage of the transistor 602

$R_{MR}$=the resistance of the MR sensor 106

Thus, the input impedance of the QCSC preamplifier 600 can be controlled based on the resistance of the MR sensor.

Because the input impedances of the QCSC preamplifiers 100, 200, 250, 300, 350, 400, 500, and 600 can be controlled or adapted, the bandwidths of the QCSC preamplifiers 100, 200, 250, 300, 350, 400, 500, and 600 can be improved. The input impedances of the QCSC preamplifiers 100, 200, 250, 300, 350, 400, 500, and 600 can be controlled to match the characteristic impedance of the interconnect 112 or to adapt to changes in the system, such as changes in the resistance values of the MR sensor 106. Thus, the limitations in the bandwidth due to mismatches between the characteristic impedance of the interconnect and the input impedance of the QCSC preamplifiers 100, 200, 250, 300, 350, 400, 500, and 600 can be reduced or eliminated. The bandwidths of the QCSC preamplifiers 100, 200, 250, 300, 350, 400, 500, and 600 can be extended, allowing for higher data rates in the disk drive 10. Consequently, performances of the QCSC preamplifiers 100, 200, 250, 300, 350, 400, 500, and 600 as well as the disk drive 10 are improved.

A method and system has been disclosed for providing a quasi current-sensing controlled input impedance preamplifier that is preferably used in the context of reading a signal from an MR sensor. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A current-sensing preamplifier for use with a magnetoresistive (MR) sensor, the current-sensing preamplifier comprising:

at least one input device providing an input impedance for the current-sensing preamplifier, the at least one input device coupled with the MR sensor through an interconnect having a characteristic impedance;

a gain stage coupled with the at least one input device; and a feedback circuit coupled with the gain stage and the at least one input device, the feedback circuit providing at least one signal to the at least one input device, the at least one signal controlling the input impedance to allow the input impedance to be capable of varying during operation of the MR sensor; and wherein the MR sensor further has a bias current, and wherein the at least one signal controls the input impedance without affecting the bias current of the MR sensor; and wherein the at least one signal further includes a first signal and a second signal, the first signal for increasing the input impedance, the second signal for decreasing the input impedance.

2. The current-sensing preamplifier of claim 1 wherein the first signal decreases a bias current of the at least one input device and the second signal decreases the bias current of the at least one input device.

3. The current-sensing preamplifier of claim 1 wherein the input impedance is controlled based on at least one error signal developed using the feedback circuit, wherein the at least one error signal further includes a first error signal and a second error signal, the first error signal for controlling the first signal, the second error signal for controlling the second signal.

4. The current-sensing preamplifier of claim 1 wherein the at least one signal controls the input impedance to substantially match the characteristic impedance of the interconnect.

5. The current-sensing preamplifier of claim 1 wherein the MR sensor has a resistance and wherein the at least one signal controls the input impedance based on the resistance of the MR sensor.

6. The current-sensing amplifier of claim 1 further comprising:

a controller for controlling the at least one signal based on at least one error signal developed using the feedback circuit.

7. The current-sensing preamplifier of claim 6 wherein the controller further receives an adjustment signal and controls the at least one signal based on the adjustment signal.

8. The current-sensing preamplifier of claim 1 wherein the gain stage further provides a single ended output signal.

9. The current-sensing preamplifier of claim 1 wherein the gain stage further provides a differential output signal.

10. A method for controlling a current-sensing preamplifier that is used with a magnetoresistive (MR) sensor, the current-sensing preamplifier including at least one input device that provides an input impedance for the current-sensing preamplifier, the at least one input device being coupled with the MR sensor through an interconnect having a characteristic impedance, the current-sensing preamplifier also including at least one gain stage coupled with the at least one input device, the method comprising the steps of:

(a) providing at least one signal to the at least one input device, the at least one signal controlling the input impedance to allow the input impedance to be capable of varying during operation of the MR sensor; and (b) controlling the at least one signal based on at least one error signals, wherein the at least one error signal can be developed using a feedback circuit coupled with the gain stage and the at least one input device; and wherein the MR sensor further has a bias current, and wherein the at least one signal controls the input impedance without affecting the bias current of the MR sensor; and wherein the step of providing the at least one signal further includes the steps of:

(a1) providing a first signal for increasing the input impedance; and (a2) providing a second signal for decreasing the input impedance.

11. The method of claim 10 wherein the first signal decreases a bias current of the at least one input device and the second signal decreases the bias current of the at least one input device.

12. The method of claim 10 wherein the step of providing the at least one error signal further includes the steps of:

(b1) providing a first error signal for controlling the first signal; and (b2) providing a second error signal for controlling the second signal.

13. The method of claim 10 wherein the at least one signal controls the input impedance to substantially match the characteristic impedance of the interconnect.

14. The method of claim 10 wherein the MR sensor has a resistance and wherein the at least one signal controls the input impedance based on the resistance of the MR sensor.

15. The method of claim 10 further comprising the steps of:

(c) providing a controller for controlling the at least one signal based on the at least one error signal.

16. The method of claim 15 wherein the controller receives an adjustment signal and controls the at least one signal based on the adjustment signal.

17. The method of claim 10 wherein the gain stage provides a single ended output signal.

18. The method of claim 10 wherein the gain stage provides a differential output signal.

* * * * *